United States Patent
Katagiri et al.

(10) Patent No.: US 11,462,707 B2
(45) Date of Patent: Oct. 4, 2022

(54) DISPLAY PANEL UTILIZING SELF-LUMINOUS ELEMENTS AND METHOD OF MANUFACTURING SAME

(71) Applicant: JOLED Inc., Tokyo (JP)

(72) Inventors: Hiroshi Katagiri, Tokyo (JP); Takahiro Komatsu, Tokyo (JP)

(73) Assignee: JOLED INC., Tokyo (JP)

( * ) Notice: Subject to any disclaimer, the term of this patent is extended or adjusted under 35 U.S.C. 154(b) by 0 days.

(21) Appl. No.: 17/027,727

(22) Filed: Sep. 22, 2020

(65) Prior Publication Data

US 2021/0098732 A1   Apr. 1, 2021

(30) Foreign Application Priority Data

Oct. 1, 2019  (JP) .............................. JP2019-181658

(51) Int. Cl.
  *H01L 51/50* (2006.01)
  *H01L 51/52* (2006.01)
  *H01L 51/56* (2006.01)

(52) U.S. Cl.
  CPC ...... *H01L 51/5092* (2013.01); *H01L 51/5218* (2013.01); *H01L 51/5234* (2013.01); *H01L 51/56* (2013.01)

(58) Field of Classification Search
  None
  See application file for complete search history.

(56) References Cited

U.S. PATENT DOCUMENTS

| | | | |
|---|---|---|---|
| 2007/0210705 A1 | 9/2007 | Yokoi et al. | |
| 2012/0104423 A1 | 5/2012 | Kurata et al. | |
| 2018/0248154 A1* | 8/2018 | Shirahase | H01L 51/5076 |
| 2021/0083017 A1* | 3/2021 | Komatsu | H01L 27/3211 |
| 2021/0111364 A1* | 4/2021 | Sakamoto | H01L 51/5092 |

FOREIGN PATENT DOCUMENTS

| | | |
|---|---|---|
| JP | 2007-317378 A | 12/2007 |
| WO | 2012/020452 A1 | 2/2012 |

* cited by examiner

*Primary Examiner* — Daniel Whalen
(74) *Attorney, Agent, or Firm* — Xsensus LLP

(57) ABSTRACT

A display panel including a substrate, anodes disposed on or above the substrate, light-emitting layers disposed on or above the anodes, a first intermediate layer disposed on or above the light-emitting layers, a second intermediate layer disposed on the first intermediate layer, and a cathode disposed on or above the second intermediate layer. The first intermediate layer includes a fluoride of a first metal or a complex of the first metal. The second intermediate layer includes a second metal. The anodes are light-transmissive and the cathode is light-reflective, or the anodes are light-reflective and the cathode is light-transmissive. The first metal is selected from a group consisting of alkali metals and alkaline earth metals. The second metal is selected from rare earth metals.

8 Claims, 13 Drawing Sheets

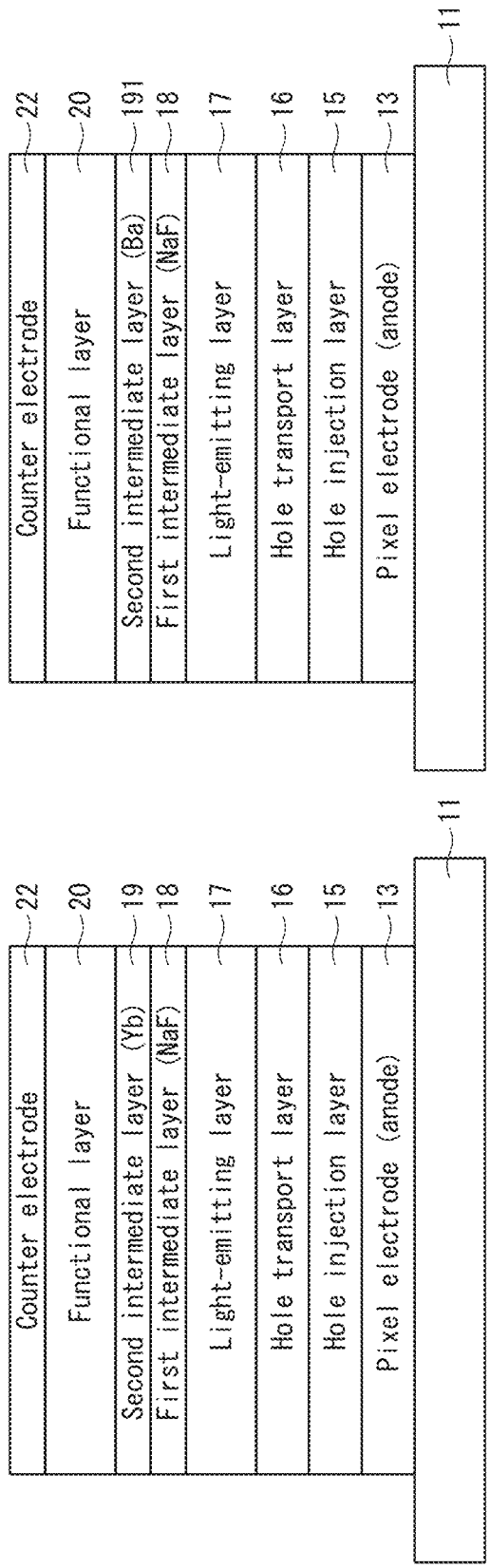

FIG. 6

| | | Embodiment example ① | Embodiment example ② | Embodiment example ③ | Embodiment example ④ | Embodiment example ⑤ | Embodiment example ⑥ | Reference example ① | Reference example ② | Reference example ③ | Reference example ④ | Reference example ⑤ | Reference example ⑥ |
|---|---|---|---|---|---|---|---|---|---|---|---|---|---|
| Light-emitting layer | | EML | EML | EML | EML | EML | EML | EML | EML | EML | EML | EML | EML |
| Additional intermediate layer | | | | ETL | | | ETL | | | ETL | | | ETL |
| | Film thickness | 0nm | 0nm | 10nm | 0nm | 0nm | 10nm | 0nm | 0nm | 10nm | 0nm | 0nm | 10nm |
| First intermediate layer | | NaF | ETL+NaF | ETL+NaF | Naq | ETL+Naq | ETL+Naq | NaF | ETL+NaF | ETL+NaF | Naq | ETL+Naq | ETL+Naq |
| | Film thickness | 1nm | 5nm | 5nm | 1nm | 5nm | 5nm | 1nm | 5nm | 5nm | 1nm | 5nm | 5nm |
| Second intermediate layer | | Yb | Yb | Yb | Yb | Yb | Yb | Ba | Ba | Ba | Ba | Ba | Ba |
| | Film thickness | 1nm | 1nm | 1nm | 1nm | 1nm | 1nm | 1nm | 1nm | 1nm | 1nm | 1nm | 1nm |
| Electron injection layer | | ETL+Yb | ETL+Yb | ETL+Yb | ETL+Yb | ETL+Yb | ETL+Yb | ETL+Ba | ETL+Ba | ETL+Ba | ETL+Ba | ETL+Ba | ETL+Ba |
| | Film thickness | 20nm | 20nm | 20nm | 20nm | 20nm | 20nm | 20nm | 20nm | 20nm | 20nm | 20nm | 20nm |
| Result | | ○ | ○ | ○ | ○ | ○ | ○ | × | △ | △ | × | △ | △ |

DISPLAY PANEL UTILIZING SELF-LUMINOUS ELEMENTS AND METHOD OF MANUFACTURING SAME

This application claims priority to Japanese Patent Application No. 2019-181658 filed Oct. 1, 2019, the contents of which are hereby incorporated by reference in their entirety.

BACKGROUND

Technical Field

The present disclosure relates to display panels including self-luminous elements utilizing electroluminescence or a quantum dot effect, and methods for manufacturing same, and in particular relates to self-luminous elements including a resonator structure.

Description of Related Art

In recent years, display devices including self-luminous elements such as organic electroluminescence (EL) elements that make use of electroluminescence and quantum light-emitting diodes (QLED) that make use of a quantum dot effect are becoming more widespread.

A self-luminous element has a structure in which at least a light-emitting layer is sandwiched between a pair of electrodes (anode and cathode). In many cases, the self-luminous element further includes, in addition to the light-emitting layer, a functional layer (electron transport layer, electron injection layer) between the light-emitting layer and the cathode, for supplying electrons to the light-emitting layer.

From the viewpoint of reducing power consumption and life extension, it is also desirable to improve light extraction efficiency from each color of self-luminous element. In order to improve light extraction efficiency, as described in WO 2012/020452, for example, there is a known technique of employing a resonator structure in organic EL elements of each color, which are self-luminous elements.

It is also known that in a self-luminous element, a good electron injection property can be obtained by using a layer containing a low work function alkali metal or alkaline earth metal for the functional layer.

However, low work function alkali metals and alkaline earth metals easily react with impurities such as water and oxygen. Thus, a functional layer containing an alkali metal or alkaline earth metal tends to deteriorate in the presence of impurities, which causes adverse effects such as a decrease in luminance efficiency and a shortened emission life in organic EL elements, which causes a decrease in storage stability.

Japanese patent 4882508 describes a structure of an organic EL element provided with an inorganic barrier layer on a light-emitting layer. When an inorganic barrier layer is provided in this way, it functions to prevent the functional layer from deteriorating due to impurities adsorbed on a surface of an organic light-emitting medium layer formed before the inorganic barrier layer.

SUMMARY

The present disclosure describes a display panel that includes self-luminous elements capable of achieving good light emission while ensuring good storage stability by ensuring sufficient blocking of impurities, and a method of manufacturing the display panel.

A display panel according to at least one embodiment of the present disclosure is a display panel including a substrate, anodes disposed on or above the substrate, light-emitting layers disposed on or above the anodes, a first intermediate layer disposed on or above the light-emitting layers, a second intermediate layer disposed on the first intermediate layer, and a cathode disposed on or above the second intermediate layer. The first intermediate layer includes a fluoride of a first metal or a complex of the first metal. The second intermediate layer includes a second metal. The anodes are light-transmissive and the cathode is light-reflective, or the anodes are light-reflective and the cathode is light-transmissive. The first metal is selected from a group consisting of alkali metals and alkaline earth metals. The second metal is selected from rare earth metals.

As described above, according to a display panel pertaining to at least one embodiment, deterioration of the cathode and an electron injection layer can be suppressed by the first intermediate layer. Further, the second intermediate layer is composed of a simple layer of a rare earth metal that is not easily oxidized, and therefore reduction of the first metal in the first intermediate layer can improve electron injection from the cathode to the light-emitting layers, while also suppressing deterioration of the second intermediate layer itself. Thus, luminance efficiency can be improved by improving electron injection from the cathode to the light-emitting layer, while also suppressing variation in luminance efficiency and deterioration over time due to high stability of the second intermediate layer.

BRIEF DESCRIPTION OF THE DRAWINGS

These and other objects, advantages, and features of the technology pertaining to the present disclosure will become apparent from the following description thereof taken in conjunction with the accompanying drawings, which illustrate at least one embodiment of the technology pertaining to the present disclosure.

FIG. 5A is a diagram of a schematic cross-section of an organic EL element according to at least one embodiment. FIG. 5B is a diagram of a schematic cross-section of an organic EL element according to a reference example.

FIG. 6 is a table illustrating a relationship between film thickness and materials of an additional intermediate layer, the first intermediate layer, and the second intermediate layer, and characteristic unevenness of the second intermediate layer, according to various embodiments and a reference example.

FIG. 10A illustrates a state in which a TFT layer is formed on a substrate, FIG. 10B illustrates a state in which an interlayer insulating layer is formed on a substrate, FIG. 10C illustrates a state in which a pixel electrode material is formed on the interlayer insulating layer, FIG. 10D illustrates a state in which pixel electrodes are formed, and FIG. 10E illustrates a state in which a bank material layer is formed on the interlayer insulating layer and the pixel electrodes.

FIG. 11A illustrates a state in which banks are formed, FIG. 11B illustrates a state in which hole injection layers are formed on the pixel electrodes, FIG. 11C illustrates a state in which hole transport layers are formed on the hole injection layers, and FIG. 11D illustrates a state in which light-emitting layers are formed on the hole transport layers.

FIG. 12A illustrates a state in which a first intermediate layer is formed on the light-emitting layers and the banks, FIG. 12B illustrates a state in which a second intermediate layer is formed on the first intermediate layer, FIG. 12C illustrates a state in which a functional layer is formed on the second intermediate layer, and FIG. 12D illustrates a state in which a counter electrode and a sealing layer are formed on the functional layer.

DETAILED DESCRIPTION

Figure 1:
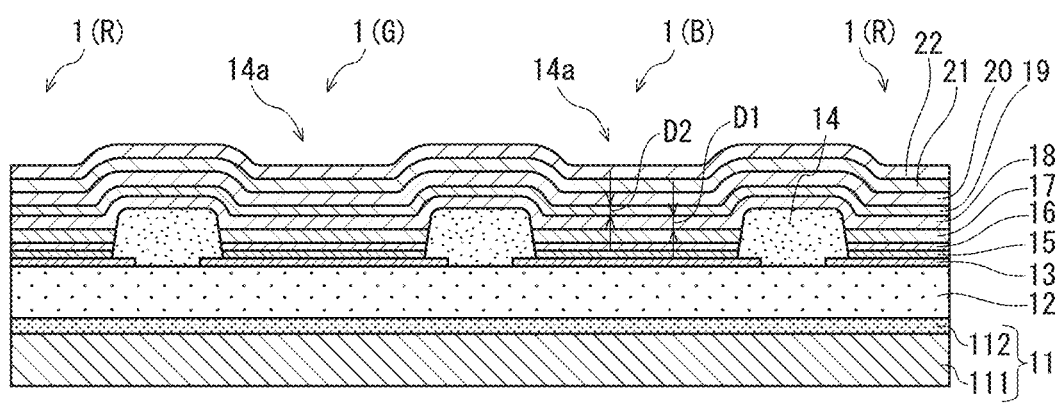
FIG. 1 is a diagram of a cross-section schematically illustrating structure of a display panel 100 according to at least one embodiment.

Background to an Aspect of the Disclosure

As described above, by forming a functional layer containing a metal selected from the alkali metals and alkaline earth metals (also referred to as a "first metal") on a light-emitting layer, excellent electron injectability from the functional layer to the light-emitting layer is achieved, but there is a problem of functional layer deterioration due a transfer of impurities such as water and oxygen from the light-emitting layer to the functional layer, and therefore there is a need for a method of preventing deterioration of the functional layer while ensuring electron injectability of the functional layer.

A fluoride of the first metal, such as NaF and LiF, has low hygroscopicity and an excellent ability to block impurities such as water and oxygen. Thus, it was found that deterioration of the functional layer due to impurities can be prevented by disposing a layer made of a fluoride of the first metal between the light-emitting layer and the functional layer.

It was then found that if a layer including a second metal that breaks a bond between fluorine and the alkali metal or alkaline earth metal is provided on an intermediate layer to release the first metal, blocking of impurities by the intermediate layer and supplying of electrons to the light-emitting layer can both be ensured. As the second metal, a metal having a reducing property is used, that is, a metal having an electron injecting property with respect to the first metal is used, such as barium, which is an alkaline earth metal. However, as described above, alkaline earth metals easily react with impurities such as water and oxygen, and the presence of impurities tends to accelerate deterioration. Thus, there is a technical problem that the effects of impurities easily occur during manufacturing and use.

The inventors carefully studied selection of the second metal and composition of the layer including the second metal, and arrived at the embodiments according to the disclosure.

Overview of Embodiments

A display panel according to at least one embodiment of the present disclosure is a display panel including a substrate, anodes disposed on or above the substrate, light-emitting layers disposed on or above the anodes, a first intermediate layer disposed on or above the light-emitting layers, a second intermediate layer disposed on the first intermediate layer, and a cathode disposed on or above the second intermediate layer. The first intermediate layer includes a fluoride of a first metal or a complex of the first metal. The second intermediate layer includes a second metal. The anodes are light-transmissive and the cathode is light-reflective, or the anodes are light-reflective and the cathode is light-transmissive. The first metal is selected from a group consisting of alkali metals and alkaline earth metals. The second metal is selected from rare earth metals.

Further, a method of manufacturing a display panel according to at least one embodiment of the present disclosure is a method including forming anodes on or above a substrate, forming light-emitting layers on or above the anodes, forming a first intermediate layer on or above the light-emitting layers, forming a second intermediate layer on the first intermediate layer, and forming a cathode on or above the second intermediate layer. According to the method, the first intermediate layer includes a fluoride of a first metal or a complex of the first metal, the second intermediate layer includes a second metal, the anodes are light-transmissive and the cathode is light-reflective, or the anodes are light-reflective and the cathode is light-transmissive, the first metal is selected from a group consisting of alkali metals and alkaline earth metals, and the second metal is selected from rare earth metals.

As described above, according to a display panel pertaining to at least one embodiment and a method pertaining to at least one embodiment, deterioration of the cathode and an electron injection layer can be suppressed by the first intermediate layer. Further, the second intermediate layer is composed of a simple layer of a rare earth metal that is not easily oxidized, and therefore reduction of the first metal in the first intermediate layer can improve electron injection from the cathode to the light-emitting layers, while also suppressing deterioration of the second intermediate layer itself. Thus, luminance efficiency can be improved by improving electron injection from the cathode to the light-emitting layer, while also suppressing variation in luminance efficiency and deterioration over time due to high stability of the second intermediate layer.

Further, the display panel and the method of manufacture may be embodied as follows:

According to at least one embodiment of the display panel, the second metal is ytterbium.

According to at least one embodiment of the method, the second metal is ytterbium.

As a result, deterioration due to oxidation of the second intermediate layer is made less likely, and electron injection is increased, and therefore variation in luminance efficiency and deterioration over time can be suppressed.

According to at least one embodiment of the display panel, a functional layer is included, the cathode is disposed above the second intermediate layer, and the functional layer is disposed on the second intermediate layer, the functional layer having at least one of an electron transporting property and an electron injecting property.

According to at least one embodiment of the method, the cathode is formed above the second intermediate layer, and a functional layer is formed on the second intermediate layer and has at least one of an electron transporting property and an electron injecting property Thus, electron injection from the cathode to the light-emitting layer is further increased, further improving luminance efficiency.

According to at least one embodiment, each region between a face of one of the anodes facing the light-emitting layers and a face of the cathode facing the light-emitting layers constitutes an optical resonator having both of the faces as reflecting surfaces.

Thus, light extraction efficiency is increased, further improving luminance efficiency.

Embodiments

The following describes a display panel including organic electroluminescence (EL) elements as self-luminous elements according to the present disclosure. The following describes illustrative examples for the purpose of explaining structure, action, and effects according to an aspect of the present disclosure, and is not intended to limit the present disclosure except when referring to essential characteristics of the invention.

1. Structure of Display Panel

FIG. 1 is a diagram of a cross-section of an organic EL display panel 100 (see FIG. 13) as a display panel according to Embodiment 1. The organic EL display panel 100 includes pixels composed of organic EL elements 1(R), 1(G), 1(B) that emit three colors of light (red, green, and blue, respectively). That is, each of the organic EL elements 1(R), 1(G), 1(B) constitutes a sub-pixel, and a set of sub-pixels having different light emission colors is a pixel. FIG. 1 illustrates a cross-section of one pixel.

In the organic EL display panel 100, each of the organic EL elements 1 is a top-emission type that emits light forwards (upwards in FIG. 1).

The organic EL elements 1(R), 1(G), 1(B) each have almost the same structure, and are therefore also referred to as the organic EL elements 1 when not distinguishing by color.

As illustrated in FIG. 1, each of the organic EL elements 1 includes a substrate 11, an interlayer insulating layer 12, a pixel electrode 13, banks 14, a hole injection layer 15, a hole transport layer 16, a light-emitting layer 17, a first intermediate layer 18, a second intermediate layer 19, a functional layer 20, a counter electrode 21, and a sealing layer 22. The pixel electrode 13 and the counter electrode 21 correspond to an anode and a cathode of the present disclosure.

The substrate 11, the interlayer insulating layer 12, the first intermediate layer 18, the second intermediate layer 19, the functional layer 20, the counter electrode 21, and the sealing layer 22 do not correspond one-to-one with pixels, and are common to a plurality of the organic EL elements 1 of the organic EL display panel 100.

<Substrate>

The substrate 11 includes a base 111 that is an insulating material and a thin film transistor (TFT) layer 112. A drive circuit is formed in the TFT layer 112 for each sub-pixel. The base 111 is a glass substrate, a quartz substrate, a plastic substrate, or the like. Examples of a plastic material include a thermoplastic resin and a thermosetting resin. Further examples include polyimide (PI), polyetherimide (PEI), polysulfone (PSu), polycarbonate (PC), polyethylene terephthalate (PET), polyethylene naphthalate (PEN), polybutylene terephthalate, various styrene-based, polyolefin-based, polyurethane-based, etc., thermoplastic elastomers, epoxy resin, unsaturated polyester, silicone resin, polyurethane, or the like, and a copolymer or a blend composed primarily of one or more of the above. According to at least one embodiment, one, or a laminate of two or more are selected so as to have durability with respect to processing temperatures.

<Interlayer Insulating Layer>

The interlayer insulating layer 12 is formed on the substrate 11. The interlayer insulating layer 12 is made of a resin material, and has a function of planarizing unevenness of a top surface of the TFT layer 112. Examples of the resin material include a positive type of photosensitive material. Examples of the photosensitive material include acrylic resin, polyimide resin, siloxane resin, phenol resin, and the like. Further, although not illustrated in FIG. 1, contact holes are formed in the interlayer insulating layer 12 for each sub-pixel.

<Pixel Electrodes>

The pixel electrodes 13 are formed on the interlayer insulating layer 12. The pixel electrodes 13 correspond one-to-one with the sub-pixels, and the pixel electrodes 13 are electrically connected to the TFT layer 112 via the contact holes in the interlayer insulating layer 12.

According to at least one embodiment, the pixel electrodes 13 function as light-reflective anodes.

Examples of metal materials that are light-reflective include silver (Ag), aluminum (Al), aluminum alloy, molybdenum (Mo), alloy of silver, palladium, and copper (APC), alloy of silver, rubidium, and gold (ARA), alloy of molybdenum and chromium (MoCr), alloy of molybdenum and tungsten (MoW), alloy of nickel and chromium (NiCr), and the like.

According to at least one embodiment, the pixel electrodes 13 are each a single metal layer, but according to at least one embodiment, the pixel electrodes 13 are each a laminated structure of a layer of metal oxide such as indium tin oxide (ITO) or indium zinc oxide (IZO) on a metal layer.

According to at least one embodiment, the anodes are light-transmissive, and in such a case the anodes include a light-transmissive electrically-conductive metal oxide and/or a light-transmissive metal thin film. Examples of the metal oxide include ITO and IZO. Examples of the metal thin film include Ag, an alloy mainly composed of Ag, Al, and an alloy mainly composed of Al. Examples of Ag alloys include magnesium silver alloy (MgAg) and indium silver alloy. Ag has a low resistivity, and Ag alloy is preferable in that it has excellent heat resistance and corrosion resistance, and can maintain good electrical conductivity over a long period of time. Examples of Al alloys include magnesium-aluminum alloy (MgAl) and lithium aluminum alloy (LiAl).

Examples of other alloys include lithium-magnesium alloy and lithium-indium alloy. According to at least one embodiment, film thickness of the metal thin film is from 1 nm to 50 nm, in order to ensure light transmission.

<Banks>

The banks 14 are disposed covering a periphery of a top surface of each of the pixel electrodes 13, leaving an area surrounded by the periphery exposed. The area of the top surface of each of the pixel electrodes 13 not covered by the banks 14 (also referred to as an "opening") corresponds to a sub-pixel. In other words, the banks 14 have openings 14a in one-to-one correspondence with sub-pixels.

According to at least one embodiment, the banks 14 are formed on the interlayer insulating layer 12 where the pixel electrodes 13 are not present. In other words, where the pixel electrodes 13 are not present, bottom surfaces of the banks 14 are in contact with a top surface of the interlayer insulating layer 12.

According to at least one embodiment, the banks 14 are made of an electrically insulating organic material (for example, acrylic resin, polyimide resin, novolac resin, phenol resin, etc.) The banks 14 function as a structure for preventing applied ink from overflowing when the light-emitting layers 17 are formed by an application method, and as a structure on which to place a deposition mask when the light-emitting layers 17 are formed by a vapor deposition method. According to at least one embodiment, the banks 14 are made of a resin material, examples of which include acrylic resin, polyimide resin, siloxane resin, and phenol resin. According to at least one embodiment, phenol resin is used.

<Hole Injection Layers>

The hole injection layers 15 are provided on the pixel electrodes to facilitate injection of holes from the pixel electrodes 13 to the light-emitting layers 17. An example of a material of the hole injection layers 15 is an electrically-conductive polymer material such as poly(3,4-ethylenedioxythiophene) polystyrene sulfonate (PEDOT:PSS).

According to at least one embodiment, the hole injection layers 15 are made of an oxide of a transition metal. Examples of transition metals include silver (Ag), molybdenum (Mo), chromium (Cr), vanadium (V), tungsten (W), nickel (Ni), and iridium (Ir). Transition metals take a plurality of oxidation states, and therefore take on a plurality of energy levels, and as a result, hole injection is facilitated because of a contribution to a reduction in drive voltage. According to at least one embodiment, the hole injection layers 15 have a large work function.

According to at least one embodiment, each of the hole injection layers 15 has a laminated structure in which a conductive polymer material is layered on an oxide of a transition metal.

<Hole Transport Layers>

The hole transport layers 16 have a function of transporting holes injected from the hole injection layers 15 to the light-emitting layers 17, and are made of an organic material with high hole mobility in order to efficiently transport the holes from the hole injection layers 15 to the light-emitting layers 17. The hole transport layers 16 are formed by applying and drying an organic material solution. Examples of organic material in the organic material solution of the hole transport layers 16 include polymer compounds such as polyfluorene, a derivative thereof, polyarylamine, and a derivative thereof.

Other examples of a material of the hole transport layers 16 include a triazole derivative, an oxadiazole derivative, an imidazole derivative, a polyarylalkane derivative, a pyrazoline derivative and a pyrazolone derivative, a phenylenediamine derivative, an arylamine derivative, an amino-substituted chalcone derivative, an oxazole derivative, a styrylanthracene derivative, a fluorenone derivative, a hydrazone derivative, a stilbene derivative, a porphyrin compound, an aromatic tertiary amine compound and a styrylamine compound, a butadiene compound, a polystyrene derivative, a hydrazone derivative, a triphenylmethane derivative, and a tetraphenylbenzene derivative. According to at least one embodiment, the porphyrin compound, the aromatic tertiary amine compound, or the styrylamine compound is used. In such a case, the hole transport layers 16 are formed by a vacuum deposition method. Material and manufacturing method of the hole transport layers 16 are not limited to those described above, any material having a hole transport function may be used, and any manufacturing method that can be used to manufacture the hole transport layers 16 can be used.

<Light-Emitting Layers>

The light-emitting layers 17 are formed in the openings 14a. The light-emitting layers 17 each have a function of emitting either R, G, or B color light via a recombination of holes and electrons. Known materials can be used as materials of the light-emitting layers 17.

When the self-luminous elements 1 are organic EL elements, examples of organic light-emitting material included in the light-emitting layers 17 include fluorescent substances such as an oxinoid compound, a perylene compound, a coumarin compound, an azacoumarin compound, an oxazole compound, an oxadiazole compound, a perinone compound, a pyrrolo-pyrrole compound, a naphthalene compound, an anthracene compound, a fluorene compound, a fluoranthene compound, a tetracene compound, a pyrene compound, a coronene compound, a quinolone compound and an azaquinolone compound, a pyrazoline derivative and a pyrazolone derivative, a rhodamine compound, a chrysene compound, a phenanthrene compound, a cyclopentadiene compound, a stilbene compound, a diphenylquinone compound, a styryl compound, a butadiene compound, a dicyanomethylene-pyran compound, a dicyanomethylene-thiopyran compound, a fluorescein compound, a pyrylium compound, a thiapyrylium compound, a selenapyrylium compound, a telluropyrylium compound, an aromatic aldadiene compound, an oligophenylene compound, a thioxanthene compound, a cyanine compound, an acridine compound, a metal complex of an 8-hydroxyquinoline compound, a metal complex of a 2-bipyridine compound, a complex of Schiff salts and Group III metals, an oxine metal complex, and a rare earth complex. According to at least one embodiment, a known phosphorescent substance such as a phosphorescent metal complex such as tris(2-phenylpyridine)iridium is used. Further, according to at least one embodiment, the light-emitting layers 17 include a high molecular weight compound such as polyfluorene, a polyfluorene derivative, polyphenylene, or a polyphenylene derivative, or a mixture of a low molecular weight compound and a high molecular weight compound. According to at least one embodiment, the self-luminous elements 1 are quantum dot light-emitting diodes (QLED), and a material of the light-emitting layers 17 is a material that has a quantum dot effect.

<First Intermediate Layer>

The first intermediate layer 18 is disposed on the light-emitting layers 17, and includes a fluoride of the first metal, which is selected from the alkali metals or the alkaline earth metals, or a complex of the first metal.

The alkali metals include lithium (Li), sodium (Na), potassium (K), rubidium (Rb), cesium (Cs), and francium (Fr), and the alkaline earth metals include magnesium (Mg), calcium (Ca), strontium (Sr), barium (Ba), and radium (Ra). A film including such a fluoride serves to block impurities. According to at least one embodiment, the complex of the first metal is a quinolinium complex such as Naq.

Thus, the first intermediate layer 18 works to prevent impurities inside and on the light-emitting layers 17, the hole transport layers 16, the hole injection layers 15, and the banks 14 from entering the functional layer 20 and the counter electrode 21.

According to at least one embodiment, the first metal is selected from Na, Li, K, Cs, Mg, Ca, and Ba.

<Second Intermediate Layer>

The second intermediate layer 19 is disposed on the first intermediate layer 18, and includes the second metal, which has a property of breaking a bond between the first metal and fluorine, or a bond in a complex including the first metal. The second metal is selected from the rare earth metals.

The second intermediate layer 19 is a layer made of the second metal. The layer made of the second metal is either a pure layer of the second metal or a metal layer having substantially the same properties as a pure layer of the second metal. That is, it suffices that the second intermediate layer 19 is a metal layer of the second metal and trace amounts of impurities, and the second intermediate layer 19 of the present disclosure includes a layer comprising only the second metal and trace amounts of impurities.

According to at least one embodiment, the second metal is ytterbium (Yb).

<Functional Layer>

The functional layer 20 is disposed on the second intermediate layer 19, and is an organic material having electron transportability, doped with a metal material for improved electron injection. Here, doping means that metal atoms or metal ions of a metal material are dispersed substantially evenly in the organic material, forming a single phase containing the organic material and a trace amount of the metal material. According to at least one embodiment, no other phase is present, in particular no phase composed of only the metal material such as a metal piece or metal film, and no other phase with the metal material as a main component. Further, according to at least one embodiment, in the single phase containing the organic material and a trace amount of the metal material, the concentration of metal atoms or metal ions is uniform, and the metal atoms or metal ions are not aggregated. According to at least one embodiment, the metal material is selected from rare earth metals. According to at least one embodiment, the metal material is ytterbium (Yb). According to at least one embodiment, an amount of the metal material dopant in the functional layer 20 is from 3 wt % to 60 wt %. According to at least one embodiment, the amount is 20 wt %.

An example of the organic material that has electron transportability is a π electron low molecular weight organic material such as an oxadiazole derivative (OXD), a triazole derivative (TAZ), a phenanthroline derivative (BCP, Bphen), or the like.

<Counter Electrode>

The counter electrode 21 is made of a light-transmissive electrically-conductive material, and is disposed on the functional layer 20. According to at least one embodiment, the counter electrode 21 functions as a light-transmissive cathode.

Examples of the light-transmissive electrically-conductive material include electrically-conductive oxides such as ITO and IZO. According to at least one embodiment, the counter electrode 21 is a metal thin film. Examples of the metal thin film include Ag, an alloy mainly composed of Ag, Al, and an alloy mainly composed of Al. Examples of Ag alloys include magnesium silver alloy (MgAg) and indium silver alloy. Ag has a low resistivity, and Ag alloy is preferable in that it has excellent heat resistance and corrosion resistance, and can maintain good electrical conductivity over a long period of time. Examples of Al alloys include magnesium-aluminum alloy (MgAl) and lithium aluminum alloy (LiAl). Examples of other alloys include lithium-magnesium alloy and lithium-indium alloy. According to at least one embodiment, film thickness of the metal thin film is from 1 nm to 50 nm, in order to ensure light transmission.

According to at least one embodiment, the pixel electrodes 13 (anodes) are light-transmissive and the counter electrode 21 is light-reflective. A metal material is an example of a light-reflective electrically-conductive material. Examples of such a metal material include silver (Ag), aluminum (Al), aluminum alloy, molybdenum (Mo), alloy of silver, palladium, and copper (APC), alloy of silver, rubidium, and gold (ARA), alloy of molybdenum and chromium (MoCr), alloy of molybdenum and tungsten (MoW), alloy of nickel and chromium (NiCr), and the like.

<Sealing Layer>

The sealing layer 22 has a function of suppressing exposure of organic layers such as the hole transport layers 16, the light-emitting layers 17, and the functional layer 20 to moisture and air, and is made of a light-transmissive material such as silicon nitride (SiN) or silicon oxynitride (SiON). Further, according to at least one embodiment, a sealing resin layer made of a resin material such as acrylic resin, silicone resin, or the like is provided on the layer made using silicon nitride (SiN), silicon oxynitride (SiON), or the like.

According to at least one embodiment, the organic EL display panel 100 is a top-emission type, and therefore the sealing layer 22 is made of a light-transmissive material.

<Other Structure>

Although not illustrated in FIG. 1, according to at least one embodiment, a color filter and/or an upper substrate is joined to the sealing layer 22 via a sealing resin. Joining the upper substrate can protect the hole transport layers 16, the light-emitting layers 17, the first intermediate layer 18, the second intermediate layer 19, and the functional layer 20 from moisture, air, and the like.

According to at least one embodiment, an additional intermediate layer is disposed between the light-emitting layers 17 and the first intermediate layer 18. The additional intermediate layer has a function of transporting electrons from the first intermediate layer 18 to the light-emitting layers 17. Examples of a material of the additional intermediate layer include an oxadiazole derivative (OXD), a triazole derivative (TAZ), a phenanthroline derivative (BCP, Bphen), and the like.

2. Impurity Blocking and Electron Injection

When the hole injection layers 15, the hole transport layers 16, and the light-emitting layers 17 are formed by wet processes, if impurities in and on these layers reach the functional layer 20 they may react with the metal dopant in the organic material of the functional layer 20, reducing function of the functional layer 20.

Further, if impurities react with the organic material, there is a risk of the organic material being altered, impairing stability.

When the banks 14 are formed by a wet process, impurities in and on the banks 14 may similarly be a cause of a reduction in function of the functional layer 20.

To counter this, the organic EL elements 1 according to at least one embodiment include the first intermediate layer 18 and the second intermediate layer 19 between the light-emitting layers 17 and the functional layer 20, and the first intermediate layer 18 includes a fluoride of an alkali metal or a fluoride of an alkaline earth metal, and therefore the fluoride prevents impurities from entering from the side of the light-emitting layers 17.

In particular, NaF has low hygroscopicity and low reactivity with oxygen, and is therefore excellent at blocking impurities and prevents impurities from entering from the side of the light-emitting layers 17. As a result, reaction of impurities with metal in the functional layer 20 can be prevented, suppressing a decrease in electron supply capacity of the functional layer 20, and further preventing the counter electrode from deteriorating due to impurities. The same effect can be obtained when LiF, KF, CsF, $MgF_2$, $CaF_2$, or $BaF_2$ is used instead of NaF.

On the other hand, NaF has high electrical insulation, and therefore there is a problem that movement of electrons supplied from the counter electrode 21 and the functional layer 20 to the light-emitting layers 17 is hindered, deteriorating light emission properties. However, according to at least one embodiment, the second intermediate layer 19, which is a metal layer made of Yb as the second metal, is disposed in contact with the first intermediate layer 18. Yb has a function of breaking the bond between Na and F in the fluoride of Na (NaF), which is the first metal in the first intermediate layer 18, and therefore a portion of the NaF in the first intermediate layer 18 separates, releasing Na.

Na has a low work function and a high electron supply capacity, and therefore assists in movement of electrons from the counter electrode 21 to the light-emitting layers 17. This suppresses a decrease in light emission, and reduce drive voltage. At the same time, excellent impurity blocking is obtained by the NaF in the first intermediate layer 18.

As described above, the first intermediate layer 18 includes a fluoride of the first metal, which has a high impurity blocking property, thereby blocking entry of impurities from the side of the light-emitting layers 17 and suppressing deterioration of electron supply capacity of the functional layer 20 (and the counter electrode 21). Further, the second intermediate layer 19 is made of the second metal that breaks the bond between the first metal and fluorine, releasing the first metal, facilitating movement of electrons from the functional layer 20 to the light-emitting layers 17, through the first intermediate layer 18 that has a high insulating property, obtaining excellent light emission properties.

In reality, there is no clear boundary between the first intermediate layer 18 and the second intermediate layer 19, and according to at least one embodiment the material of the first intermediate layer 18 and the material of the second intermediate layer 19 are somewhat mixed during manufacture. That is, the film thicknesses of the first intermediate layer 18 and the second intermediate layer 19 are not exactly D1 nm and D2 nm, respectively, and a boundary between them may not be clear.

However, concentration of the first metal is higher on the side of the light-emitting layers 17 than on the side of the functional layer 20, and the concentration of the second metal is higher on the side of the functional layer 20 than on the side of the light-emitting layers 17, and therefore the effects described above are achieved.

Here, when the first intermediate layer 18 and the second intermediate layer 19 are present, and are formed by a method intended to result in film thicknesses of D1 and D2, respectively, it is assumed that the film thicknesses of the intermediate layer 18 and the second intermediate layer 19 are D1 and D2, respectively. The same applies to film thicknesses of other layers.

3. Film Thickness of Second Intermediate Layer and Luminance Efficiency Ratio

Figure 2:
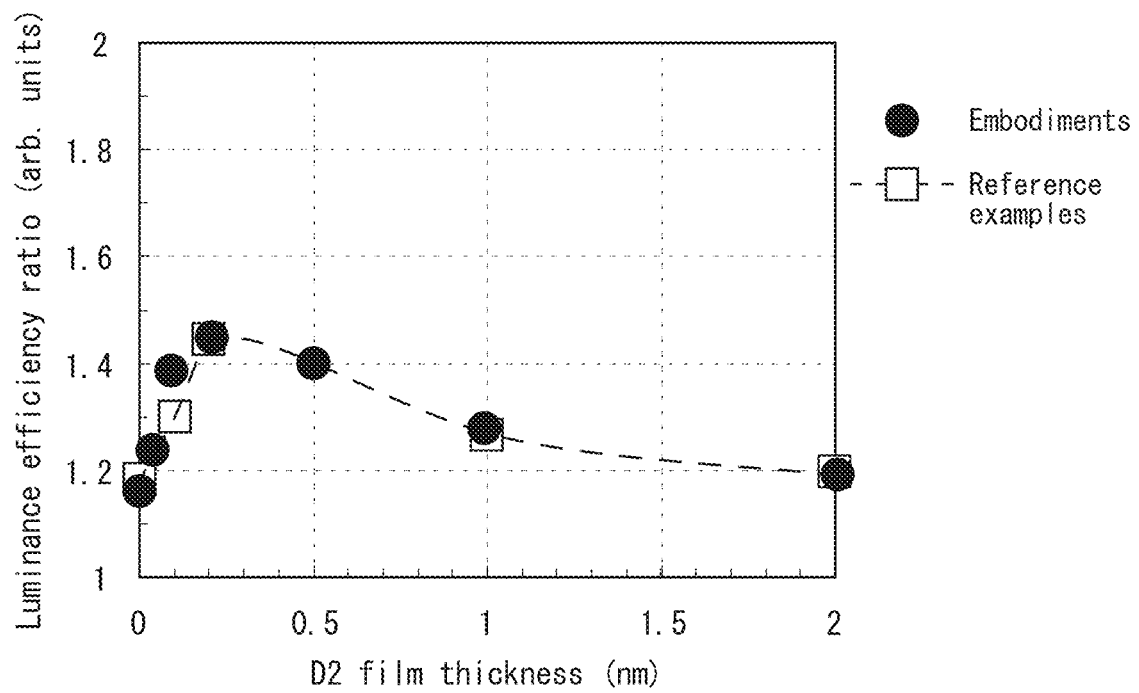
FIG. 2 is a graph illustrating changes in luminance efficiency ratio due to differences in materials and film thickness of second intermediate layers.

FIG. 2 is a graph illustrating luminance efficiency ratios of embodiments with different film thicknesses D2 of the second intermediate layer 19, and reference examples in which a second intermediate layer 191 made of metal barium is provided instead of the second intermediate layer 19. FIG. 5A is a schematic diagram of a cross-section of an organic EL element according to at least one embodiment. FIG. 5B is a schematic diagram of a cross-section of an organic EL element according to a reference example. In each of the embodiments and the reference examples, the film thickness D1 of the first intermediate layer 18 is 4 nm.

A voltage was applied to each of the embodiments and each of the reference examples such that current density was 10 $mA/cm^2$, luminance at that time was measured, and luminance efficiency was calculated from the measured luminance. The luminous efficiency for each example is plotted as a relative value on the graph.

As illustrated in FIG. 2, in each of the embodiments and reference examples, the highest luminance efficiency ratio is shown when the film thickness D2 of the second intermediate layer 19 is 0.2 nm. A reason for this is thought to be that since the amount of holes injected from the pixel electrodes 13 to the light-emitting layers 17 is constant, when the film thickness D2 of the second intermediate layer 19 is 0.2 nm, electrons and holes in the light-emitting layers 17 are balanced, and even if more electrons are injected, this only increases current density and does not increase luminance. Further, the results indicate that there is no difference in luminous efficiency of a self-luminous element with Yb or Ba as the material of the second independent layer 19.

4. Film Thickness and Storage Stability of First Intermediate Layer

Figure 3A:
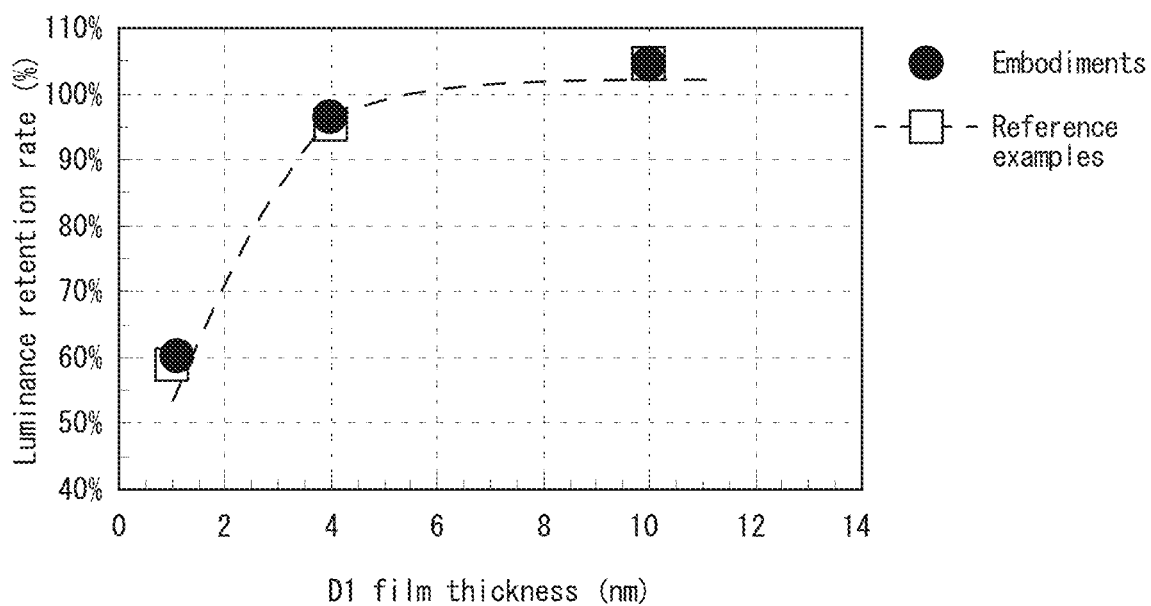
FIG. 3A is a graph illustrating differences in luminance retention due to differences in materials of second intermediate layers and differences in film thickness of first intermediate layers.

FIG. 3A is a graph illustrating results of storage stability tests performed for embodiments and reference examples which have different values for the film thickness D1 of the first intermediate layer 18.

For each of the embodiments and reference examples, after measuring luminance in an initial state (initial luminance), luminance was measured again after being stored for 7 days in an 80° C. environment, and a luminance retention rate (ratio of luminance after high temperature storage to initial luminance (%)) was calculated.

As illustrated in FIG. 3A, when the film thickness D1 of the first intermediate layer 18 is 1 nm, the luminance retention rate is 59% and storage stability is low, but when the film thickness D1 is 4 nm or more, the luminance retention rate is 95% or more, showing good storage stability.

This indicates that good storage stability can be obtained when the film thickness D1 of the first intermediate layer 18 is 4 nm or more.

In the test where the film thickness D1 is 10 nm, the result indicates a luminance retention rate exceeding 100%. This indicates that a balance between holes and electrons deviated from an optimum state before the high temperature storage, and the optimum state was approached due to the high temperature storage.

Further, the results indicate that there is no difference in storage stability of a self-luminous element with Yb or Ba as the material of the second independent layer 19.

Figure 3B:
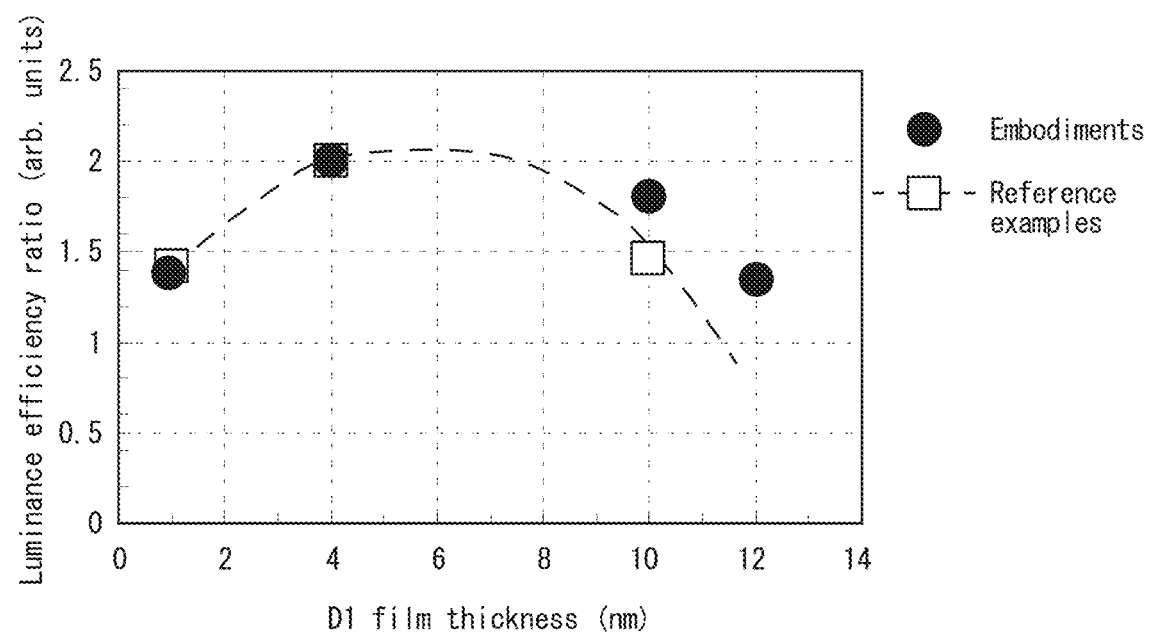
FIG. 3B is a graph illustrating differences in luminance efficiency ratio due to differences in materials of second intermediate layers and differences in film thickness of first intermediate layers.

5. Film Thickness of First Intermediate Layer and Luminance Efficiency Ratio FIG. 3B is a graph illustrating luminance efficiency ratios of embodiments and reference examples having different values of the film thickness D1 of the first intermediate layer 18. The luminous efficiency ratio for each example was measured by applying a voltage such that current density was 10 mA/cm$^2$ and measuring the luminance at that time, and luminance efficiency was calculated from the measured luminance, as described under the heading "3. Film thickness of second intermediate layer and luminance efficiency ratio".

As illustrated in FIG. 3B, in both the embodiments and the reference examples, luminance efficiency increased when the film thickness was about 6 nm, and luminance efficiency decreased when the film thickness was 1 nm and when 10 nm.

Possible causes for this are as follows. If the film thickness D1 of the first intermediate layer 18 becomes too thin, an absolute amount of the first metal decreases, and electron injection to the light-emitting layers 17 deteriorates. On the other hand, if the film thickness D1 of the first intermediate layer 18 becomes too thick, the first metal that remains bonded to fluorine functions as an insulator, and therefore luminance efficiency deteriorates.

Figure 4:
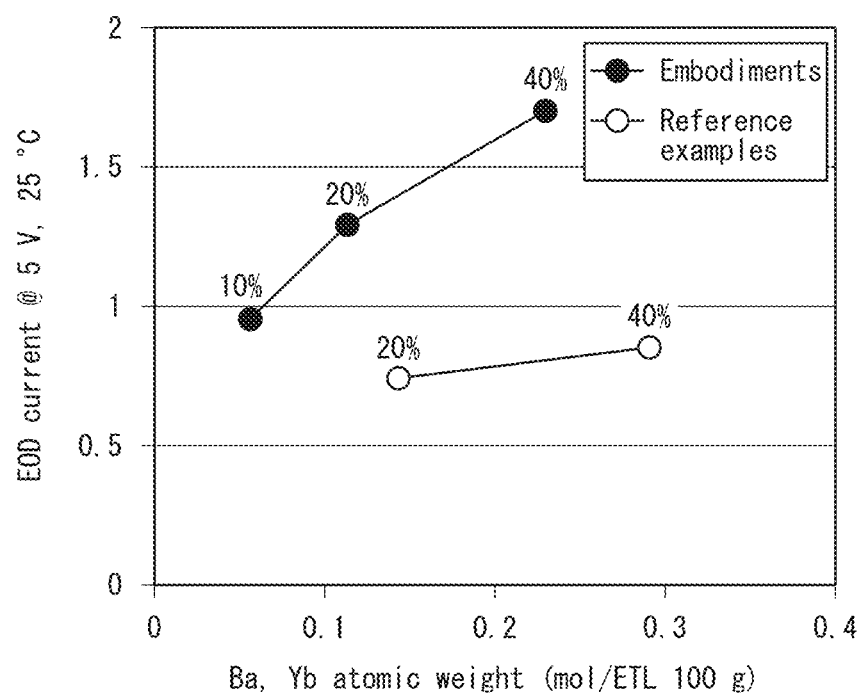
FIG. 4 is a graph illustrating differences in electron injection properties of Yb and Ba.

When Ba was used as the second metal, the luminance efficiency was similar between the reference example having a film thickness D1 of 10 nm and the reference example having a film thickness D1 of 1 nm, whereas when Yb was used as the second metal, the luminance efficiency was similar between the embodiment having a film thickness D1 of 12 nm and the embodiment having a film thickness D1 of 1 nm That is, an upper limit of the film thickness D1 is larger in the embodiment in which Yb is used as the second metal than in the reference example in which Ba is used as the second metal. The reason for this is considered to be that Yb as the second metal has a stronger function of breaking bonds between the first metal and fluorine in the fluoride of the first metal than Ba as the second metal. FIG. 4 is a graph illustrating a relationship between concentration of Yb or Ba and current density in an organic EL element including an electron injection layer doped with Yb or Ba that does not include a hole injection layer (an electron-only device (EOD)). As illustrated in FIG. 4, the electron injection layer doped with Yb has a higher current density and higher electron injection property than the electron injection layer doped with Ba, that is, Yb has a higher electron injection property than Ba. Accordingly, it appears that when Yb is used as the second metal, the effect of injecting electrons into cations of the first metal (Na+ according to at least one embodiment) to reduce is stronger than when Ba is used as the second metal.

6. Film Forming Stability of Second Intermediate Layer

As illustrated in FIG. 6, various embodiments and reference examples of organic EL display panels were manufactured having different combinations of film thickness and composition of the first intermediate layer 18 and presence or absence of an additional intermediate layer between the light-emitting layers 17 and the first intermediate layer 18, and film forming stability of the second intermediate layer 19 was evaluated.

According to embodiment examples 3 and 6 and reference examples 3 and 6, a film having a 10 nm film thickness made of an oxadiazole derivative (OXD), which is an electron-transporting material, is formed as the additional intermediate layer between the light-emitting layers 17 and the first intermediate layer 18. Further, according to embodiment examples 2 and 3 and reference examples 2 and 3, instead of a vapor-deposition layer of NaF, the first intermediate layer 18 is a co-deposited layer of NaF and an oxadiazole derivative (OXD), which is an electron transporting material. Further, according to embodiment example 4 and reference example 4, instead of a vapor-deposition layer of NaF, Naq is used for the first intermediate layer 18. According to embodiment examples 5 and 6 and reference examples 5 and 6, instead of a vapor-deposition layer of NaF, the first intermediate layer 18 is a co-deposited layer of Naq and an oxadiazole derivative (OXD), which is an electron transporting material.

According to the embodiment examples 1-6, a single layer of Yb having a film thickness of 1 nm was used as the second intermediate layer 19, and according to the reference examples 1-6, a single layer Ba having a film thickness of 1 nm was used as the second intermediate layer 19.

The results show a state of the second intermediate layer, indicated by a ○ (circle), Δ (triangle), or X (cross), where circle, triangle, cross, in this order indicate progressively more uneven properties and more mixing of an oxide of the second metal with a hydroxide of the second metal. Here, uneven properties indicates a decrease in function as the second intermediate layer, such as a decrease in electron injection or a decrease in light transmission due to entry of an oxide of the second metal or a hydroxide of the second metal, and in particular, non-uniformity of function due to local deterioration.

As illustrated in FIG. 6, according to the reference examples 1 and 4 in which the first intermediate layer 18 is a NaF layer or a Naq layer, uneven properties occurred in the Ba layer, which is the second intermediate layer 191. In particular, according to reference examples 1 and 4, white turbidity was locally generated due to barium hydroxide $(Ba(OH)_2)$, and in such areas, electron injectability decreased and light transmittance also changed, and therefore occurrence of unevenness is a property of Ba layers. Further, according to the reference examples 2, 3, 5, and 6, in which the first intermediate layer 18 is a co-deposited layer of NaF or Naq having a film thickness of 5 nm, uneven properties occurred in the Ba layer that is the second intermediate layer 191. The cause of the uneven properties appears to be Ba being oxidized by oxygen and/or moisture when the second intermediate layer 191 is formed, or due to moisture evaporated from the light-emitting layers 17 or lower layers reacting with Ba to generate barium oxide and/or barium hydroxide. According to the reference examples 2, 3, 5, and 6, the film thickness of the first intermediate layer 18 is larger than in the reference examples 1 and 4, and therefore an amount of moisture that permeates the first intermediate layer 18 to reach the Ba is small, and therefore uneven properties did not occur to the same extent as in the reference examples 1 and 4.

On the other hand, according to the embodiment examples 1-6, no uneven properties occurred in the Yb layer that is the second intermediate layer 19, and turbidity due to oxides and hydroxides did not occur. A cause of this is that reactivity with water of Yb, which is a rare earth metal, is sufficiently lower than that of Ba, and therefore quality deterioration due to water does not occur.

7. Optical Film Thickness of Each Layer and Optical Resonator Structure

Figure 7:
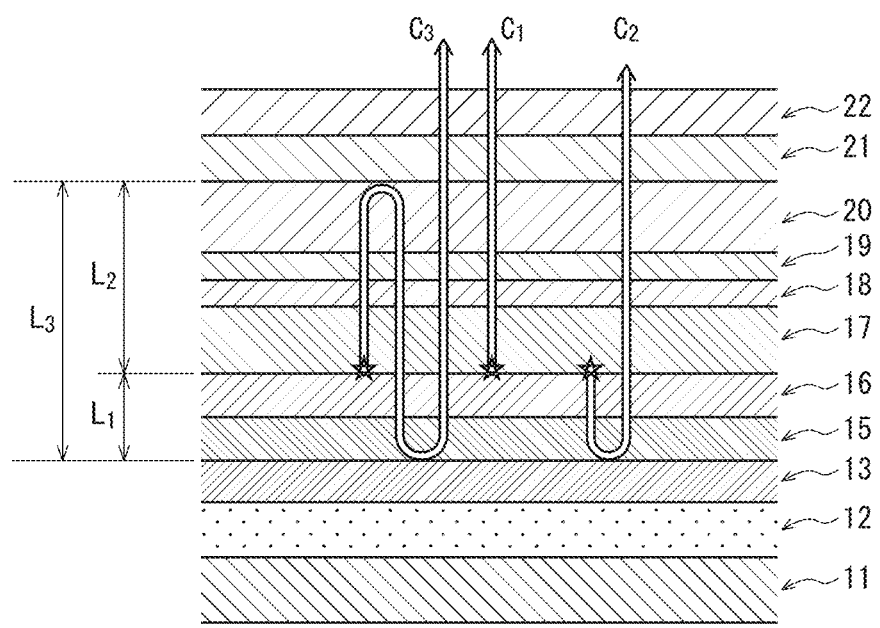
FIG. 7 is a diagram of a schematic cross-section illustrating light interference in an optical resonator structure formed in an organic EL element 1.

FIG. 7 is a diagram illustrating light interference in an optical resonator structure of an organic EL element according to at least one embodiment.

In the optical resonator structure of the organic EL element 1, light is emitted from the vicinity of the interface between the light-emitting layer 17 and the hole transport layer 16, and transmitted through each layer. Part of the light is reflected at interfaces between layers, and therefore interference occurs. The following examples of interference are the main ones.

A first interference is interference between a first optical path C1 and a second optical path C2. The first optical path C1 is a path of a portion of light emitted from the light-emitting layer 17 towards the counter electrode 21 and transmitted through the counter electrode 21 to be emitted outside the light-emitting element. The second optical path C2 is a path of a portion of light emitted from the light-emitting layer 17 towards the pixel electrode 13, reflected at the pixel electrode 13, transmitted through the light-emitting layer 17 and the counter electrode 21, and emitted outside the light-emitting element. Thus, there is interference between this directly emitted and reflected light.

An optical film thickness L1 illustrated in FIG. 7 corresponds to a difference in optical distance between the first optical path C1 and the second optical path C2. The optical film thickness L1 is a total optical distance (product in nanometers of film thickness and refractive index) of the hole injection layer 15 and the hole transport layer 16 sandwiched between the light-emitting layer 17 and the pixel electrode 13.

Further, a third optical path C3 is a path of a portion of light emitted from the light-emitting layer 17 towards the counter electrode 21, reflected at the counter electrode 21, reflected again at the pixel electrode 13, and emitted outside the light-emitting element.

A second interference is interference between light on the third optical path C3 and light on the second optical path C2.

A difference in optical distance between the second optical path C2 and the third optical path C3 corresponds to an optical film thickness L2 illustrated in FIG. 7. The optical film thickness L2 is a total optical distance of the light-emitting layer 17, the first intermediate layer 18, the second intermediate layer 19, and the functional layer 20.

Further, a third interference is interference between light on the third optical path C3 and light on the first optical path C1. A difference in optical distance between the first optical path C1 and the third optical path C3 corresponds to an optical film thickness L3 illustrated in FIG. 7. The optical film thickness L3 is the sum of the optical film thickness L1 and the optical film thickness L2 (L3=L1+L2). The optical film thickness L3 is a total optical distance of the hole injection layer 15, the hole transport layer 16, the light-emitting layer 17, the first intermediate layer 18, the second intermediate layer 19, and the functional layer 20 sandwiched between the pixel electrode 13 and the counter electrode 21.

Typically, in an optical resonator structure, light extraction efficiency is adjusted to an optical film thickness indicating a maximum value. The optical film thickness L1 between the light-emitting layer 17 and the pixel electrode 13, the optical film thickness L2 between the light-emitting layer 17 and the counter electrode 21, and the optical film thickness L3 between the pixel electrode 13 and the counter electrode 21 are all set such that light on the optical paths described above interferes constructively to increase light extraction efficiency.

Figure 8:
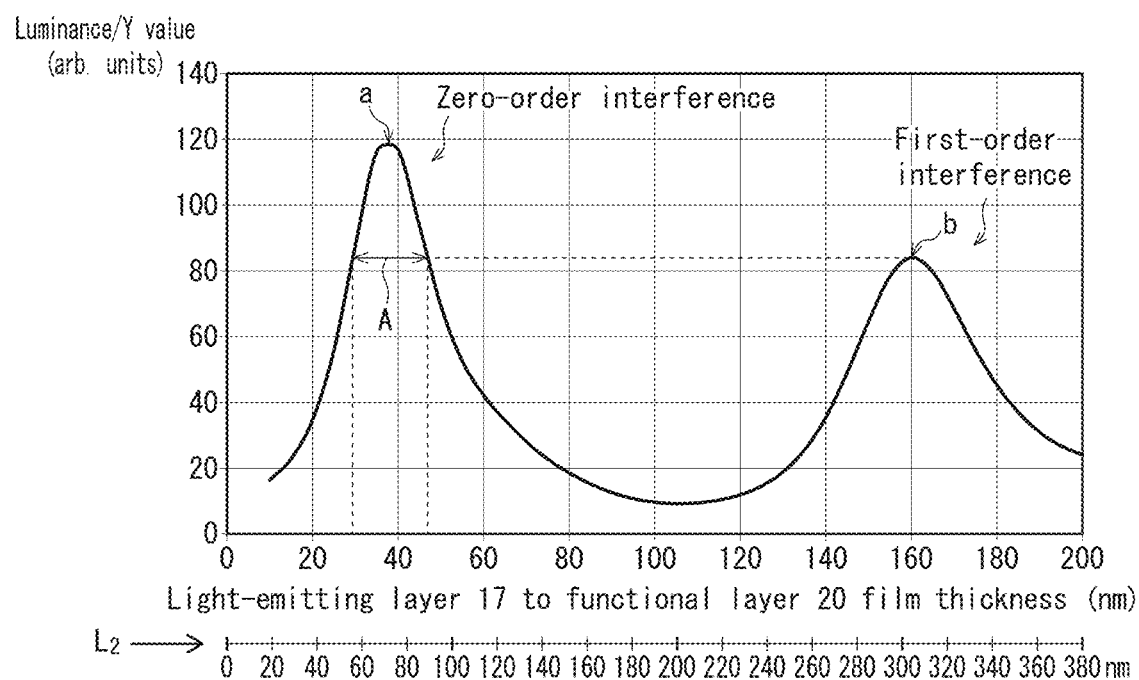
FIG. 8 is a graph illustrating a relationship between luminance/Y value of light extracted from the organic EL element 1 and film thickness from an anode-side surface of a light-emitting layer 17 to an interface between a functional layer 20 and a counter electrode 21.

According to at least one embodiment, and as illustrated in FIG. 8, each optical path length is designed to maximize light extraction efficiency. Specifically, the optical film thickness L2 is designed so that film thickness from the light-emitting layer 17 to the functional layer 20 has a length a that causes zero-order interference or a length b that causes first-order interference.

8. Review

As described above, according to a display panel pertaining to at least one embodiment, deterioration of the cathode and the electron injection layer can be suppressed by the first intermediate layer. Further, the second intermediate layer is composed of a simple layer of a rare earth metal that is not easily oxidized, and therefore reduction of the first metal in the first intermediate layer can improve electron injection from the cathode to the light-emitting layers, while also suppressing deterioration of the second intermediate layer itself. Thus, luminance efficiency can be improved by improving electron injection from the cathode to the light-emitting layer, while also suppressing variation in luminance efficiency and deterioration over time due to high stability of the second intermediate layer.

9. Method of Manufacturing Display Panel

Figure 9:
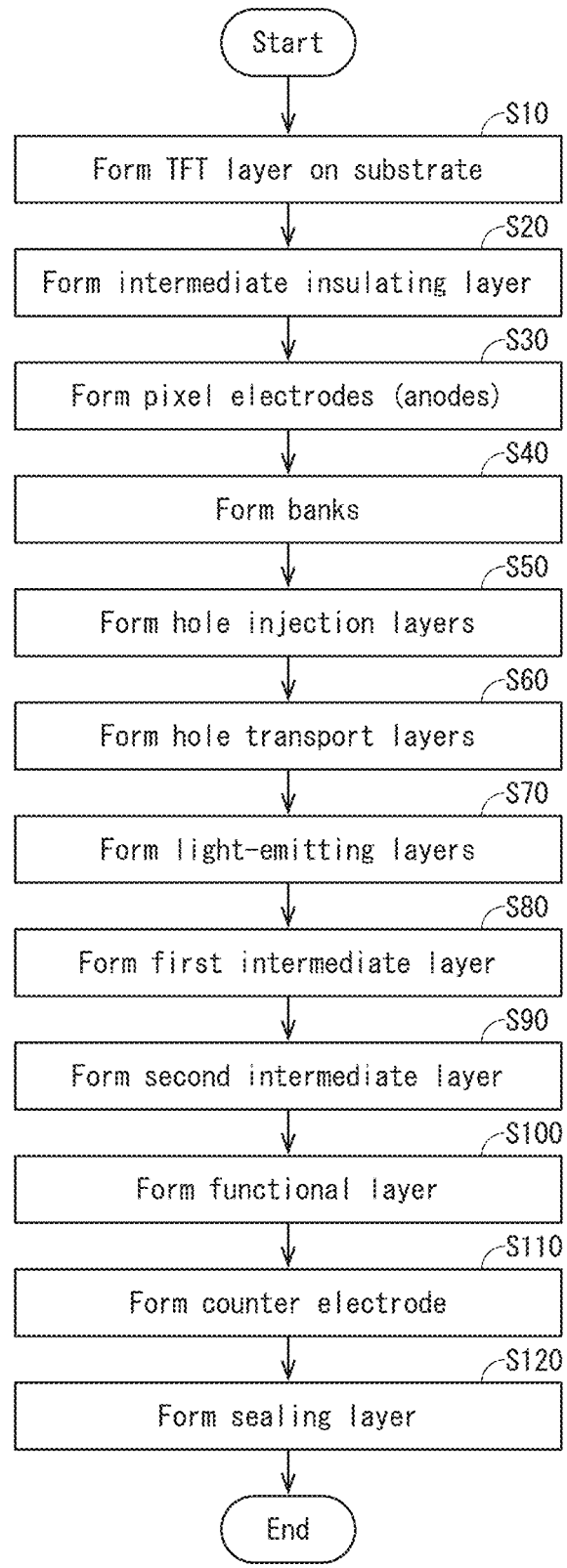
FIG. 9 is a flowchart illustrating an organic EL display panel manufacturing process according to at least one embodiment.

The following describes a method of manufacturing a display panel, with reference to the drawings. FIG. 9 is a flowchart illustrating a method of manufacturing a display panel 100 according to at least one embodiment. FIG. 10A to 10E, 11A to 11D, 12A to 12D are diagrams illustrating schematic cross-sections of the organic EL element 1 at different stages in manufacture.

(1) Forming Substrate 11

Figure 10A:
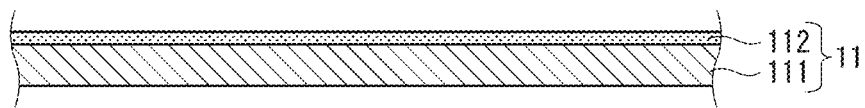
FIG. 10A, 10B, 10C, 10D, 10E are diagrams schematically illustrating partial cross-sections of steps in manufacture of an organic EL display panel according to at least one embodiment, where

First, as illustrated in FIG. 10A, the TFT layer 112 is formed on the base 111 to form the substrate 11 (step S10). The TFT layer 112 can be formed by a known method for manufacturing TFTs.

(2) Forming Interlayer Insulating Layer 12

Figure 10B:
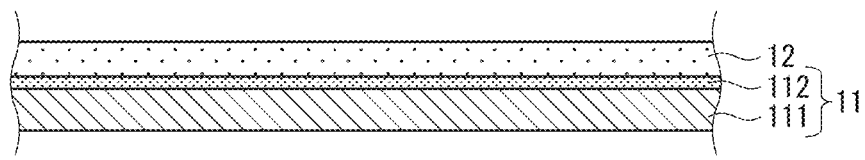

Next, as illustrated in FIG. 10B, the interlayer insulating layer 12 is formed on the substrate 11 (step S20). The interlayer insulating layer 12 is formed by using a method such as plasma chemical vapor deposition (CVD) or sputtering.

Next, a dry etching method is performed on the interlayer insulating layer 12 at locations on source electrodes of the TFT layer 112 to form contact holes. The contact holes are formed such that bottoms of the contact holes expose top surfaces of the source electrodes.

Subsequently, connecting electrode layers are formed along inner walls of the contact holes. A portion of each of the connecting electrodes is disposed on the interlayer insulating layer 12. The connecting electrode layers are formed by using a sputtering method, for example, and after metal film formation, patterning is performed using a photolithography method and a wet etching method.

(3) Forming Pixel Electrodes 13

Figure 10C:
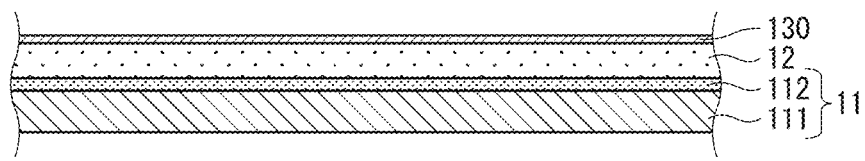

Next, as illustrated in FIG. 10C, a pixel electrode material layer 130 is formed on the interlayer insulating layer 12. The pixel electrode material layer 130 is formed by a vacuum deposition method, a sputtering method, or the like.

Figure 10D:
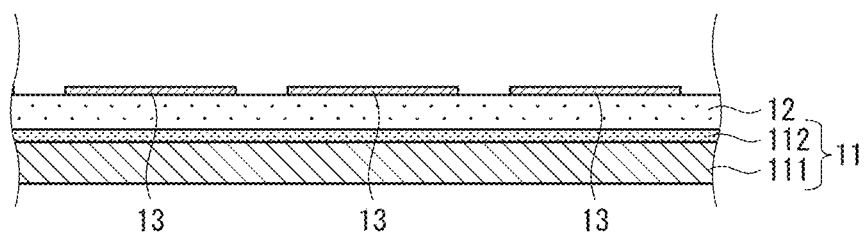

Next, as illustrated in FIG. 10D, the pixel electrode material layer 130 is patterned by etching to form the pixel electrodes 13 divided into sub-pixels (step S30).

(4) Forming Banks 14

Figure 10E:
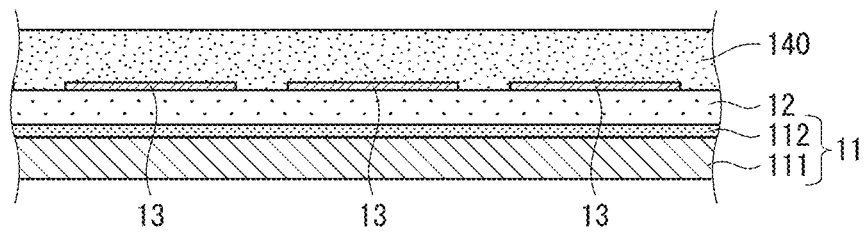

Next, as illustrated in FIG. 10E, a bank material layer 140 is formed by applying bank layer resin, which is a material of the banks 14, on the pixel electrodes 13 and the interlayer insulating layer 12. The bank material layer 140 is formed on the pixel electrodes 13 and the interlayer insulating layer 12 by using a spin coating method or the like to uniformly apply a solution of a phenol resin dissolved in a solvent (for example, a mixed solvent of ethyl lactate and gamma-Butyrolactone (GBL)), where the phenol resin is the material of the banks 14. Next, the banks 14 are formed by pattern exposure and development of the bank material layer 140 (FIG. 11A), and baking the banks 14 (step S40). As a result, the openings 14a are formed, which are areas for forming the light-emitting layers 17. Baking of the banks 14 is performed for 60 minutes at a temperature from 150° C. to 210° C., for example.

According to at least one embodiment, surfaces of the banks 14 are surface-treated with a defined alkaline solution, water, organic solvent, or the like, or are subjected to plasma treatment. This is done to adjust contact angles of the banks 14 with respect to ink (solution) applied to the openings 14a, or to impart water repellency to surfaces of the banks 14.

(5) Forming Hole Injection Layers 15

Figure 11A:
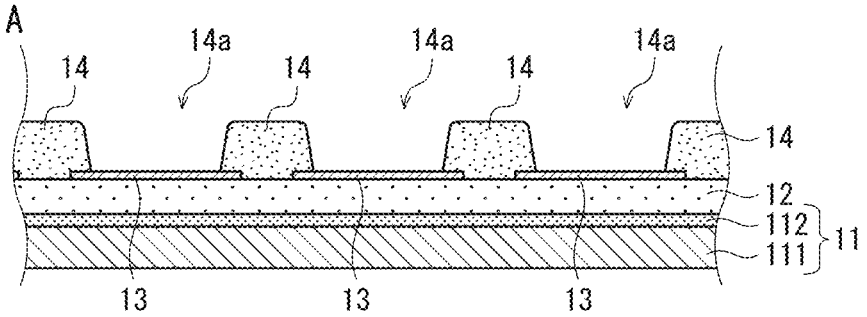
FIG. 11A, 11B, 11C, 11D are diagrams schematically illustrating partial cross-sections of steps in manufacture of an organic EL display panel according to at least one embodiment, where
Figure 11B:
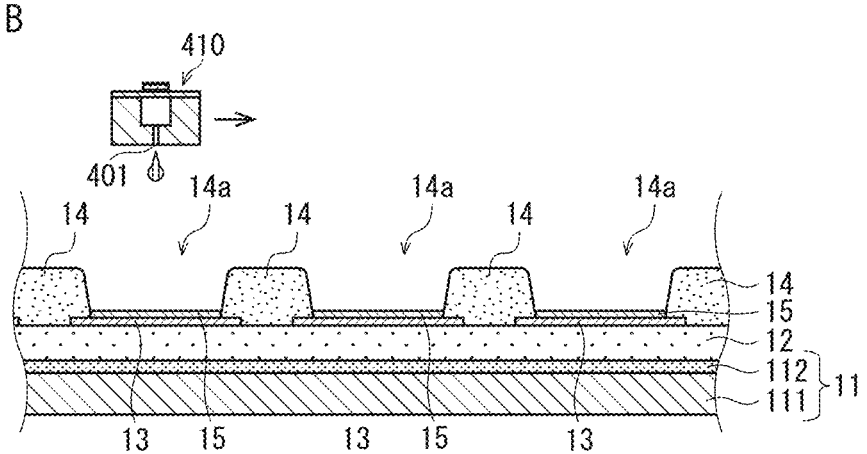

Next, as illustrated in FIG. 11B, ink containing a material of the hole injection layers 15 is discharged from nozzles 401 of an inkjet head 410 into the openings 14a defined by the banks 14 to coat the pixel electrodes 13 in the openings 14a, then baked (dried) to form the hole injection layers 15 (step S50).

Film formation of the hole injection layers 15 is not limited to this application method, and according to at least one embodiment the hole injection layers 15 are formed by a method such as vapor deposition. Further, when the hole injection layers 15 are formed by vapor deposition or sputtering, then according to at least one embodiment, a hole injection material layer made of material of the hole injection layers 15 is formed on the pixel electrode material layer 130 after formation of the pixel electrode material layer 130 in step S30, then the pixel electrode material layer 130 and the hole injection material layer are patterned by the same patterning process to form laminates of the pixel electrodes 13 and the hole injection layers 15.

(6) Forming Hole Transport Layers 16

Figure 11C:
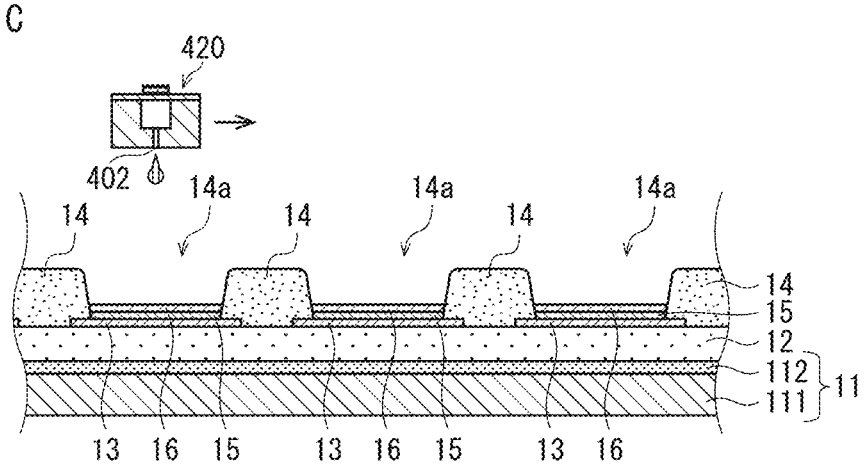

Next, as illustrated in FIG. 11C, ink containing a material of the hole transport layers 16 is discharged from nozzles 402 of an inkjet head 420 into the openings 14a defined by the banks 14 to coat the hole injection layers 15 in the openings 14a, then baked (dried) to form the hole transport layers 16 (step S60).

Film formation of the hole transport layers 16 is not limited to this application method, and according to at least one embodiment the hole transport layers 16 are formed by a method such as vapor deposition. Further, when the pixel electrodes 13, the hole injection layers 15, and the hole transport layers 16 are all formed by vapor deposition or sputtering, then according to at least one embodiment each layer is patterned by the same patterning process, as described above.

(7) Forming Light-Emitting Layers 17

Figure 11D:
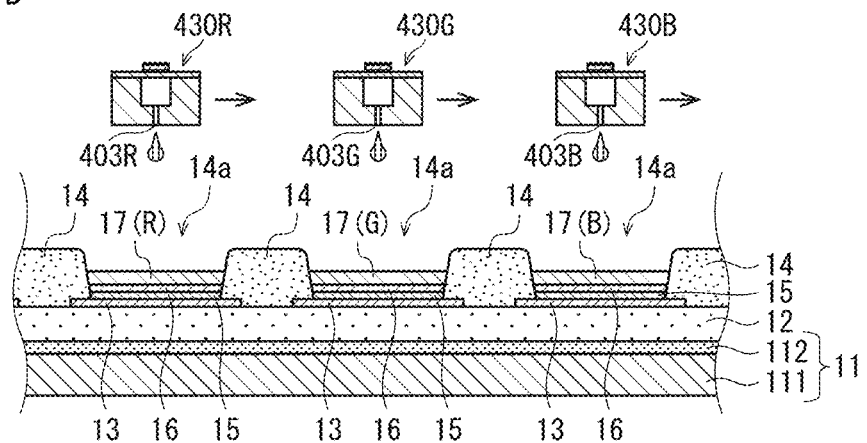

Next, as illustrated in FIG. 11D, inks containing materials of the light-emitting layers 17 are discharged from nozzles 403R of an inkjet head 430R, nozzles 403G of an inkjet head 430G, and nozzles 403B of an inkjet head 430B to coat the hole transport layers 16 in the openings 14a, then baked (dried) to form the light-emitting layers 17 (step S70).

(8) Forming First Intermediate Layer 18

Figure 12A:
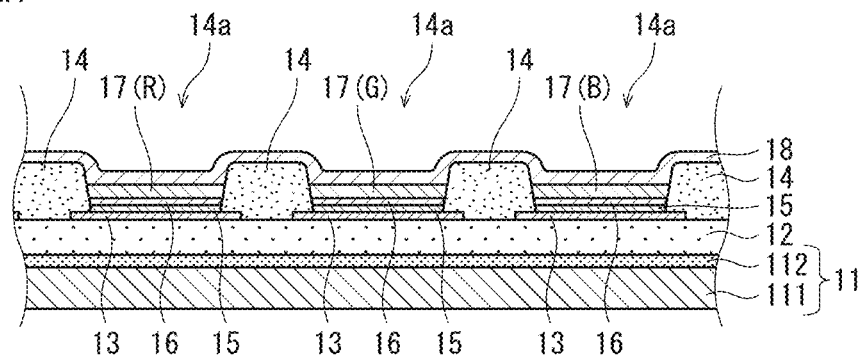
FIG. 12A, 12B, 12C, 12D are diagrams schematically illustrating partial cross-sections of steps in manufacture of an organic EL display panel according to at least one embodiment, where

Next, as illustrated in FIG. 12A, the first intermediate layer 18 is formed on the light-emitting layers 17 and the banks 14 (step S80). The first intermediate layer 18 is formed, for example, by a vacuum deposition method depositing a film of NaF across all sub-pixels.

(9) Forming Second Intermediate Layer 19

Figure 12B:
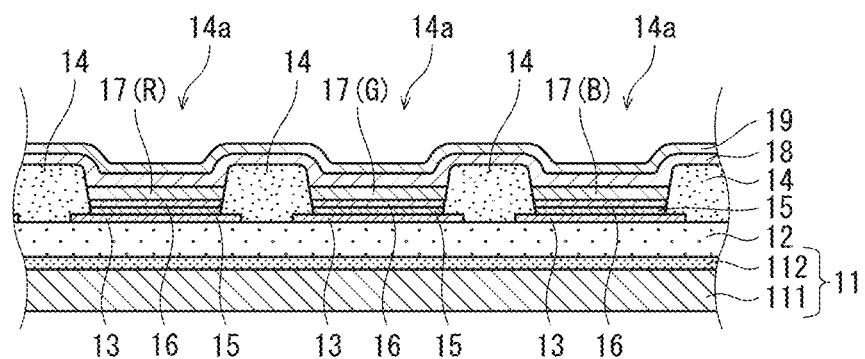

Next, as illustrated in FIG. 12B, the second intermediate layer 19 is formed on the first intermediate layer 18 (step S90). The second intermediate layer 19 is formed, for example, by using a vacuum deposition method to deposit a film of Yb across all sub-pixels.

(10) Forming Functional Layer 20

Figure 12C:
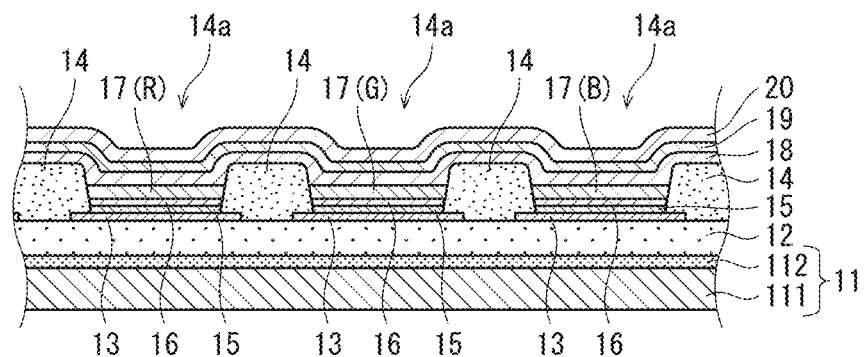

Next, as illustrated in FIG. 12C, the functional layer 20 is formed on the second intermediate layer 20 (step S100). The functional layer 20 is formed, for example, by using a co-deposition method to deposit a film of an electron-transporting organic material and a dopant of ytterbium across all sub-pixels.

(11) Forming Counter Electrode 21

Next, the counter electrode 21 is formed on the functional layer 20 (step S110). The counter electrode 21 is formed by using a sputtering method or vacuum deposition method to deposit a film of a material such as ITO, IZO, Ag, Al, or the like.

(12) Forming Sealing Layer 22

Figure 12D:
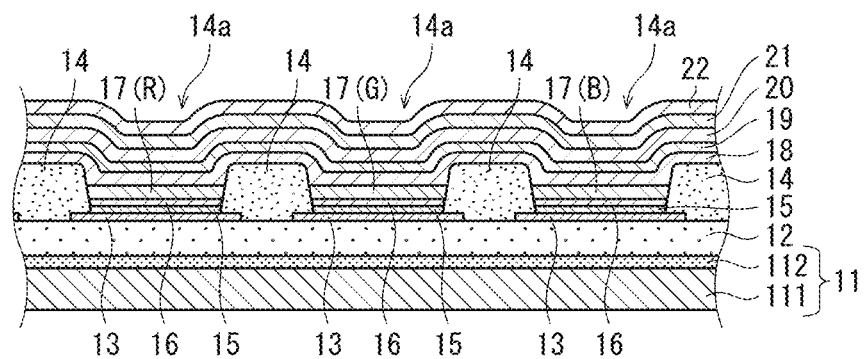

Next, as illustrated in FIG. 12D, the sealing layer 22 is formed on the counter electrode 21 (step S120). The sealing layer 22 is formed by using a sputtering method or CVD method to deposit a film of SiN, SiON, or the like.

According to at least one embodiment, a color filter and/or upper substrate are placed on and joined to the sealing layer 22.

10. Overall Structure of Display Device

Figure 13:
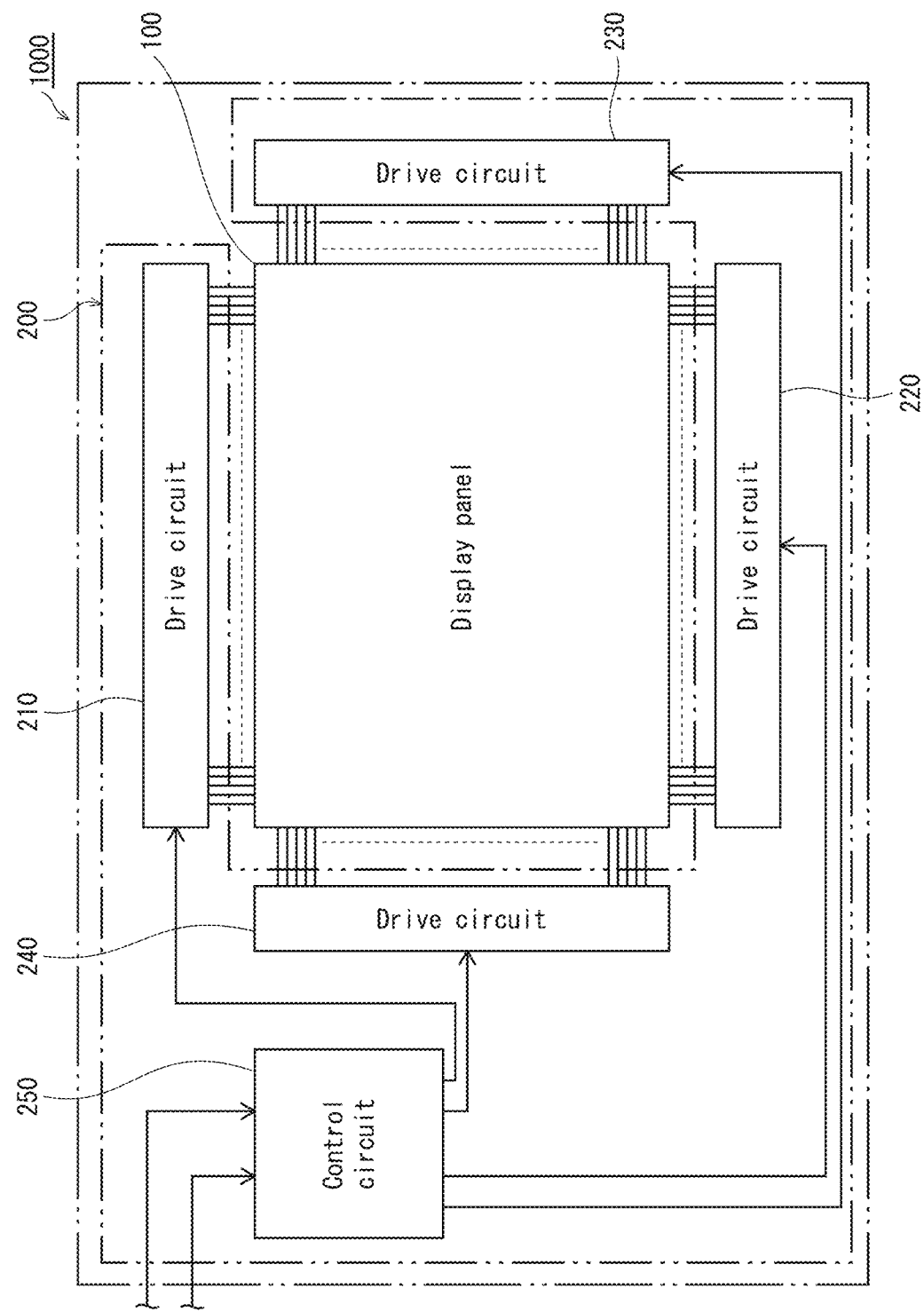
FIG. 13 is a block diagram illustrating structure of a display device according to at least one embodiment.

FIG. 13 is a schematic block diagram illustrating structure of a display device 1000 including the organic display panel 100. As illustrated in FIG. 12, the display device 1000 includes the organic EL display panel 100 and a drive controller 200 connected to the organic EL display panel 100. The drive controller 200 includes four drive circuits 210, 220, 230, 240 and a control circuit 250.

In the organic EL display device 1000, arrangement of the drive controller 200 with respect to the organic EL display panel 100 is not limited to the example illustrated.

Modifications (1) According to at least one embodiment, the self-luminous element (organic EL element) 1 includes the functional layer 20 and does not include the additional intermediate layer, but the present disclosure is not limited to this example. According to at least one embodiment, both the additional intermediate layer and the functional layer 20 are included, according to at least one embodiment, the additional intermediate layer is included and the functional layer 20 is not, and according to at least one embodiment, the additional intermediate layer and the functional layer 20 are not included.

Similarly, the hole injection layers 15 and the hole transport layers 16 do not have to be part of the structure, and according to at least one embodiment, only one of the two are included, and according to at least one embodiment, instead of the hole injection layers 15 and the hole transport layers 16 a hole injection and transport layer is included that provides both functions.

(2) According to at least one embodiment, the organic EL display panel includes three types of light-emitting layers emitting R, G, and B light, respectively, but according to at least one embodiment, the number of types of light-emitting layers is two, or four or more. Here, the type of light-emitting layer indicates film thickness of the light-emitting layer and the functional layer, and even if the color of light emitted is the same, if the film thicknesses of the light-emitting layers or functional layers are different, the light-emitting layers are considered to be of different "types". Further, arrangement of the light-emitting layers is not limited to an arrangement ordered RGBRGB . . . . According to at least one embodiment, the light-emitting layers are ordered RGBBGRRGB . . . , and according to at least one embodiment an auxiliary electrode layer or other non-light-emitting area is provided between pixels.

(3) According to at least one embodiment, the hole injection layers 15, the hole transport layers 16, and the light-emitting layers 17 in the organic EL elements 1 are all formed by ink application, but the present disclosure is not limited to this example. According to at least one embodiment, these layers are formed by using a vacuum deposition method, a sputtering method, or the like.

(4) According to at least one embodiment, the cathode is the counter electrode, and the organic EL display device is a top-emission device. However, according to at least one embodiment, the display device is a bottom-emission device.

(5) Although the organic EL display panel and the organic EL display device pertaining to the present disclosure have been described based on the embodiments and modifications above, the present disclosure is not limited to the embodiment and modifications described above. The present disclosure also includes embodiments obtained by various modifications of the embodiments that would occur to a person skilled in the art, and embodiments obtained by any combination of structure and function of the embodiments and modifications that does not depart from the spirit of the present invention.

The invention claimed is:

1. A display panel comprising:
a substrate;
anodes disposed on or above the substrate;
light-emitting layers disposed on or above the anodes;
a first intermediate layer disposed on or above the light-emitting layers, the first intermediate layer including a fluoride of a first metal or a complex of the first metal;
a second intermediate layer disposed on the first intermediate layer, the second intermediate layer being a metal layer made of a second metal; and
a cathode disposed on or above the second intermediate layer, wherein
the anodes are light-transmissive and the cathode is light-reflective, or the anodes are light-reflective and the cathode is light-transmissive,
the first metal is selected from a group consisting of alkali metals and alkaline earth metals,
the second metal is selected from rare earth metals,
the display panel further comprises a functional layer,
the cathode is disposed above the second intermediate layer, and
the functional layer is disposed on the second intermediate layer and has at least one of an electron transporting property and an electron injecting property.

2. The display panel of claim 1, wherein
the second metal is ytterbium.

3. The display panel of claim 1, wherein
each region between a face of one of the anodes facing the light-emitting layers and a face of the cathode facing the light-emitting layers constitutes an optical resonator having both of the faces as reflecting surfaces.

4. A method of manufacturing a display panel comprising:
forming anodes on or above a substrate;
forming light-emitting; layers on or above the anodes;
forming a first intermediate layer on or above the light-emitting layers, the first intermediate layer including a fluoride of a first metal or a complex of the first metal;
forming a second intermediate layer on the first intermediate layer, the second intermediate layer being a metal layer made of a second metal; and
forming a cathode on or above the second intermediate layer, wherein
the anodes are light-transmissive and the cathode is light-reflective; or the anodes are light-reflective and the cathode is light-transmissive,
the first metal is selected from a group consisting of alkali metals and alkaline earth metals,
the second metal is selected from rare earth metals,
the method further comprises forming a functional layer,
the cathode is formed above the second intermediate layer, and
the functional layer is formed on the second intermediate layer and has at least one of an electron transporting property and an electron injecting property.

5. The method of claim 4, wherein
the second metal is ytterbium.

6. The method of claim 4, wherein
each region between a face of one of the anodes facing the light-emitting layers and a face of the cathode facing the light-emitting layers constitutes an optical resonator having both of the faces as reflecting surfaces.

7. The method of claim 4, wherein
the second intermediate layer is a pure metal layer of the second metal.

8. A display panel comprising:
a substrate;
anodes disposed on or above the substrate;
light-emitting layers disposed on or above the anodes;
a first intermediate layer disposed on or above the light-emitting layers, the first intermediate layer including a fluoride of a first metal or a complex of the first metal;
a second intermediate layer disposed on the first intermediate layer, the second intermediate layer being a metal layer made of a second metal; and
a cathode disposed on or above the second intermediate layer, wherein
the anodes are light-transmissive and the cathode is light-reflective, or the anodes are light-reflective and the cathode is light-transmissive,
the first metal is selected from a group consisting of alkali metals and alkaline earth metals,
the second metal is selected from rare earth metals, and
the second intermediate layer is a pure metal layer of the second metal.

* * * * *